(12) United States Patent
Toraille et al.

(10) Patent No.: US 12,308,360 B2
(45) Date of Patent: May 20, 2025

(54) COLOUR DISPLAY DEVICE COMPRISING A MOSAIC OF TILES OF LIGHT-EMITTING MICRO-DIODES

(71) Applicant: THALES, Courbevoie (FR)

(72) Inventors: Vincent Toraille, Moirans (FR); Nicolas Bensaou, Moirans (FR); Hugues Lebrun, Moirans (FR)

(73) Assignee: THALES, Courbevoie (FR)

(\*) Notice: Subject to any disclaimer, the term of this patent is extended or adjusted under 35 U.S.C. 154(b) by 455 days.

(21) Appl. No.: 17/784,657

(22) PCT Filed: Dec. 16, 2020

(86) PCT No.: PCT/EP2020/086373
§ 371 (c)(1),
(2) Date: Jun. 12, 2022

(87) PCT Pub. No.: WO2021/122710
PCT Pub. Date: Jun. 24, 2021

(65) Prior Publication Data
US 2023/0011687 A1      Jan. 12, 2023

(30) Foreign Application Priority Data

Dec. 17, 2019   (FR) ...................................... 1914572

(51) Int. Cl.
*H01L 25/16*   (2023.01)
*H10H 20/01*   (2025.01)
(Continued)

(52) U.S. Cl.
CPC ......... *H01L 25/167* (2013.01); *H10H 20/018* (2025.01); *H10H 20/819* (2025.01);
(Continued)

(58) Field of Classification Search
CPC ....... H01L 33/501; H01L 33/58; H01L 33/44; H01L 33/20; H01L 33/0093
See application file for complete search history.

(56) References Cited

U.S. PATENT DOCUMENTS

| | | | |
|---|---|---|---|
| 8,835,903 B2 * | 9/2014 | Gwo .................... | H10H 20/818 438/22 |
| 9,029,880 B2 * | 5/2015 | Sakariya .............. | H10D 86/441 257/98 |

(Continued)

FOREIGN PATENT DOCUMENTS

| | | |
|---|---|---|
| EP | 3 091 577 A1 | 11/2016 |
| EP | 3 210 241 B1 | 8/2017 |
| EP | 3 217 442 A1 | 9/2017 |

*Primary Examiner* — Mark W Tornow
(74) *Attorney, Agent, or Firm* — BakerHostetler

(57) ABSTRACT

A color display device includes a matrix of light sources, each light source comprising a single micro-light-emitting diode, the light sources being of three different colors, each color pixel of the matrix comprising three sources emitting in the three different colors. In the device, the matrix is formed by a group of elementary components of identical shape, each elementary component comprising at least two light-emitting diodes emitting in one of the three spectral bands—the shape of the light-emitting diodes being either a triangle, or a quadrilateral, or a pentagon—the elementary components being assembled in threes such that their respective diodes touch one another by one of their sides, the group formed by the three sources associated with the three diodes forming a color pixel.

21 Claims, 9 Drawing Sheets

(51) Int. Cl.
   *H10H 20/819*   (2025.01)
   *H10H 20/84*    (2025.01)
   *H10H 20/851*   (2025.01)
   *H10H 20/855*   (2025.01)

(52) U.S. Cl.
   CPC .......... *H10H 20/84* (2025.01); *H10H 20/855* (2025.01); *H10H 20/0361* (2025.01); *H10H 20/8511* (2025.01)

(56) References Cited

U.S. PATENT DOCUMENTS

| | | |
|---|---|---|
| 2009/0195144 A1  | 8/2009 | Kitabayashi |
| 2014/0056003 A1* | 2/2014 | Frattalone ............. G09F 9/3026 |
| | | 362/249.06 |
| 2015/0022078 A1  | 1/2015 | Huang et al. |
| 2017/0179192 A1* | 6/2017 | Zhang ................. H01L 27/1255 |
| 2017/0213502 A1* | 7/2017 | Henry .................... H01L 33/62 |
| 2019/0157339 A1* | 5/2019 | Brick ...................... H01L 33/08 |
| 2019/0189044 A1* | 6/2019 | Perälä .................. G09G 3/2074 |
| 2019/0244937 A1  | 8/2019 | Honjo et al. |

\* cited by examiner

[Fig. 1]
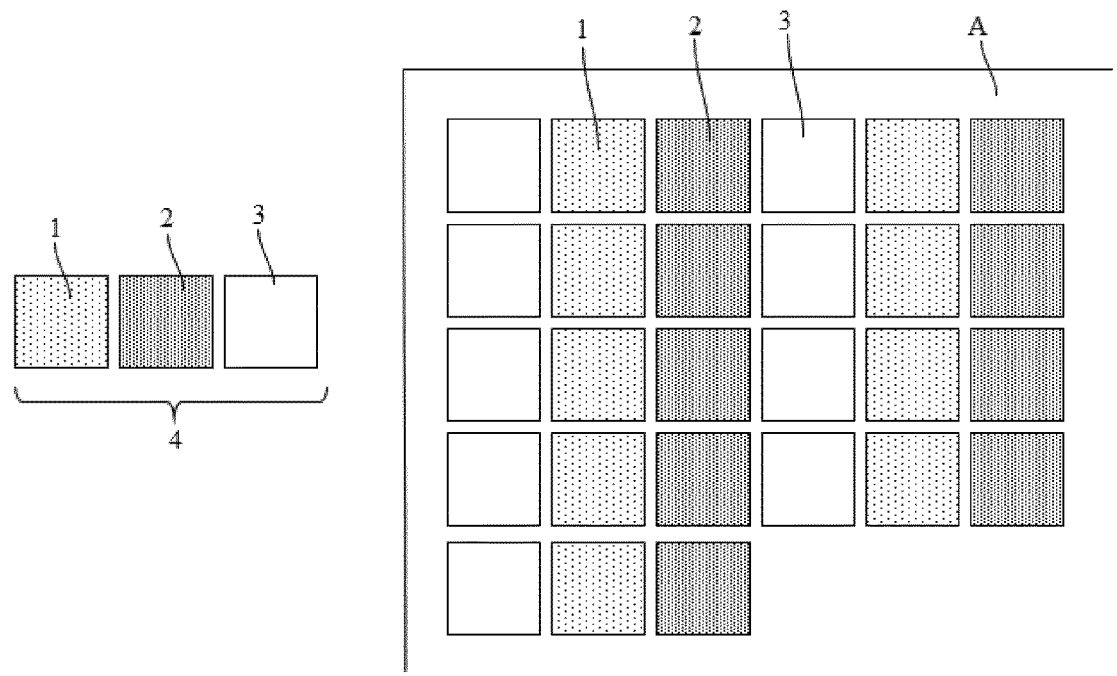
[Fig. 2]
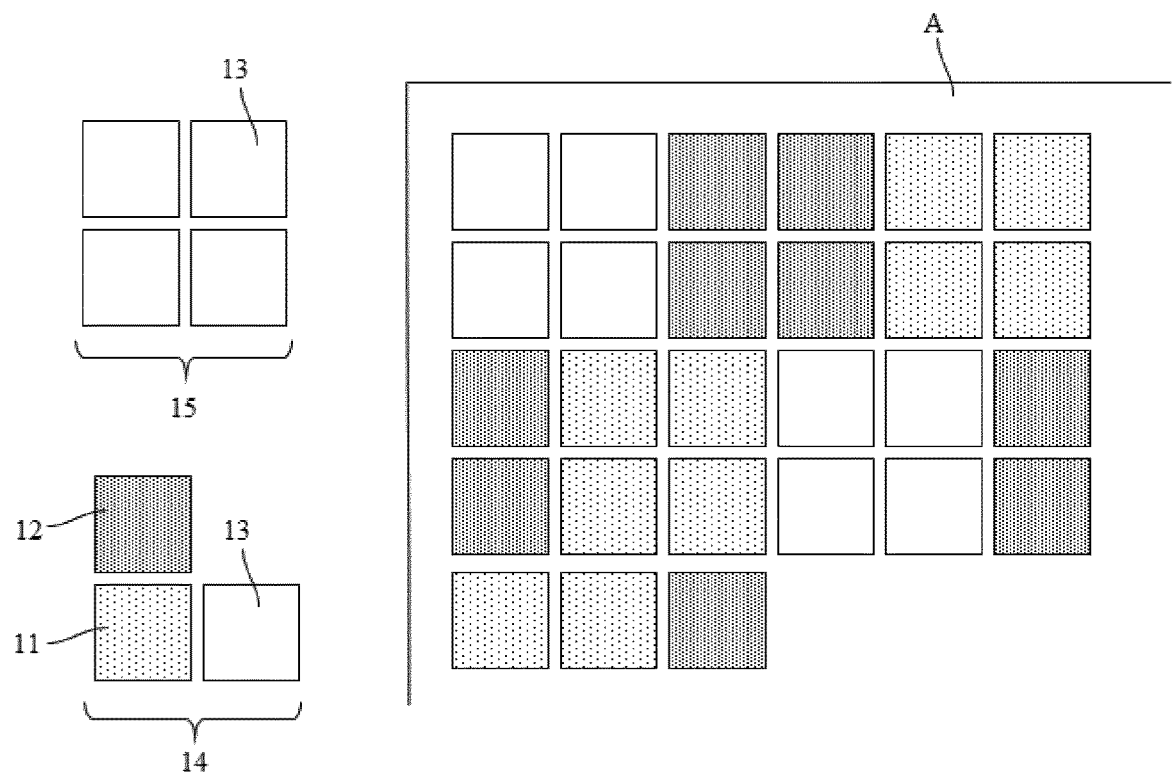

[Fig. 3]
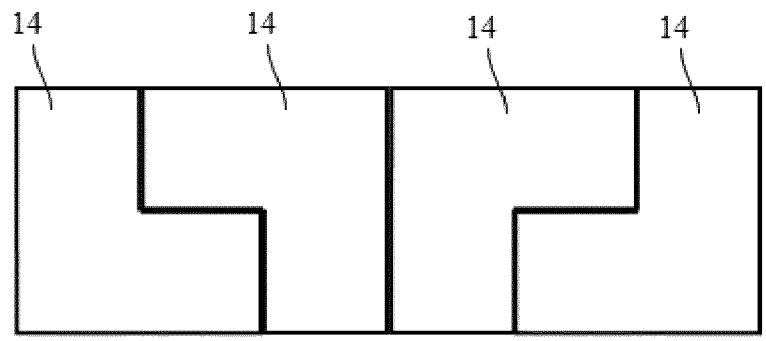
[Fig. 4]
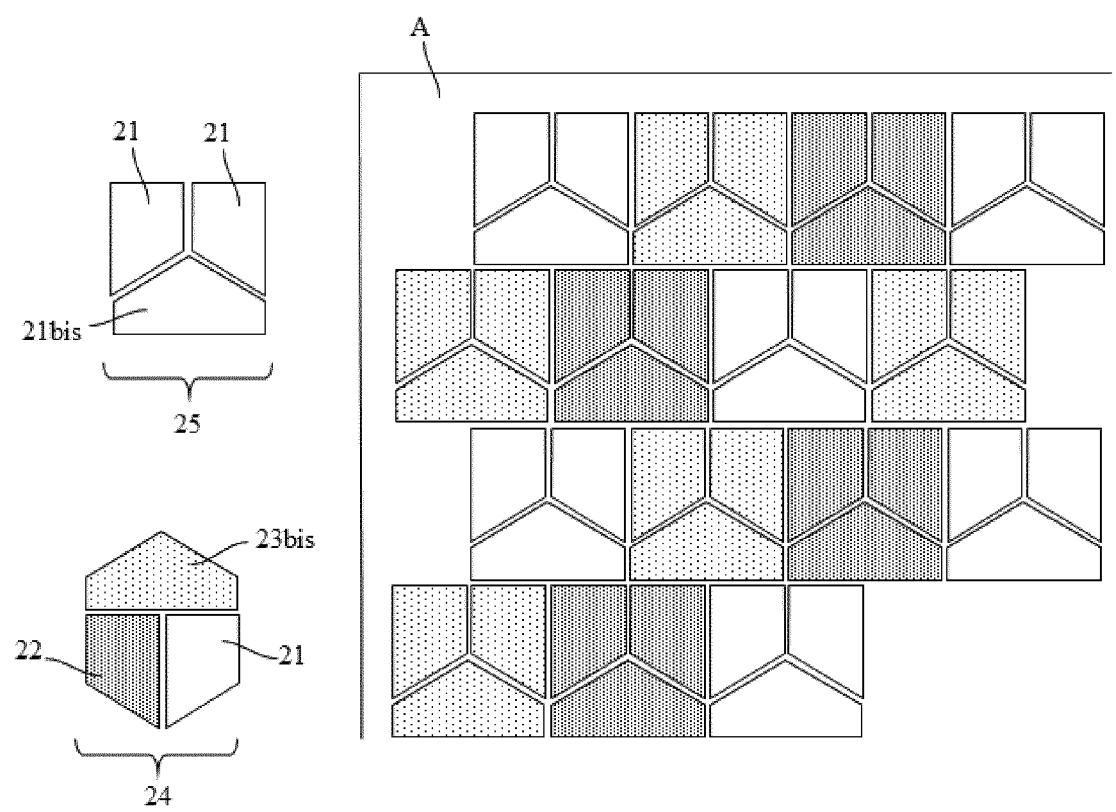

[Fig. 5]
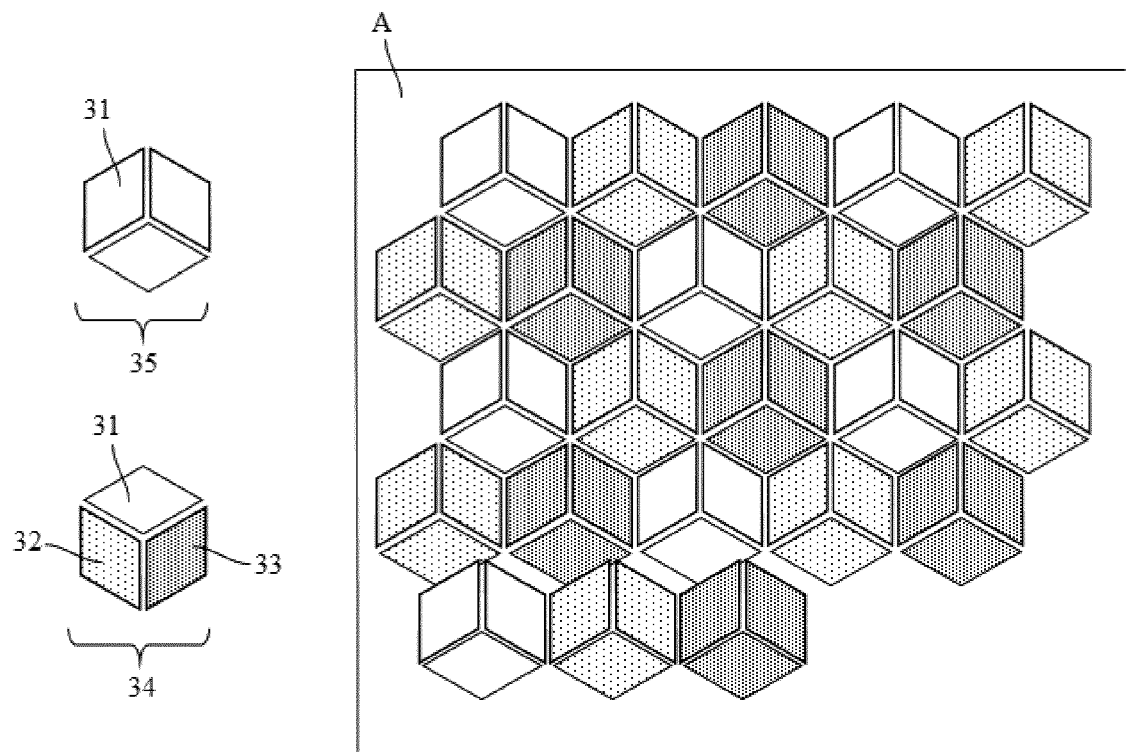
[Fig. 6]
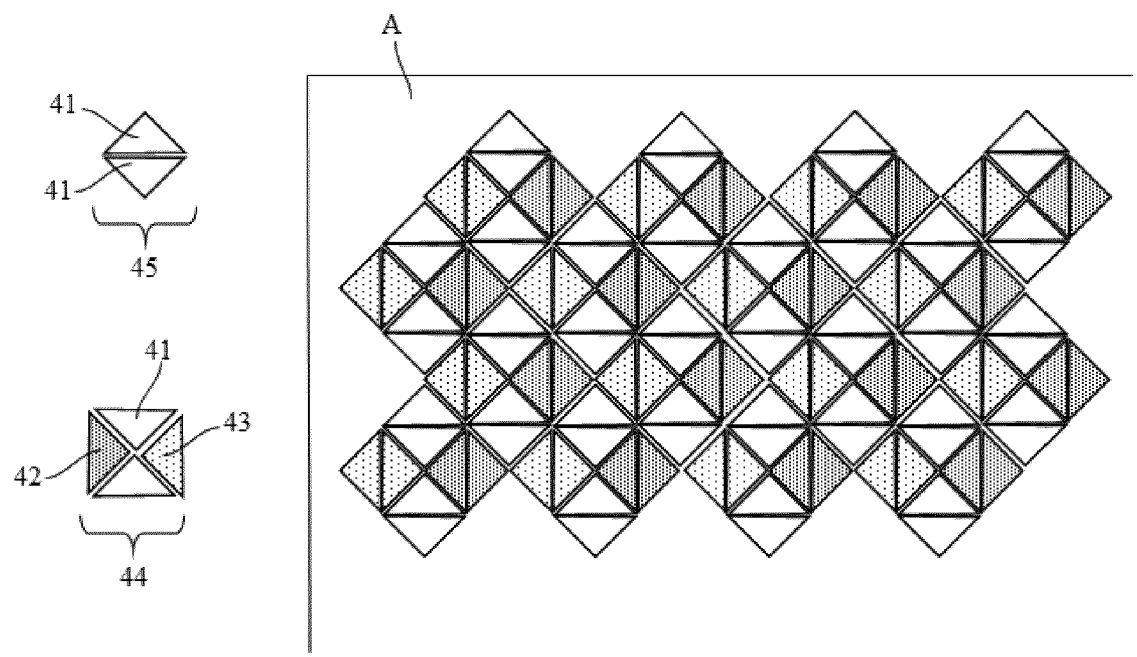

[Fig. 7]
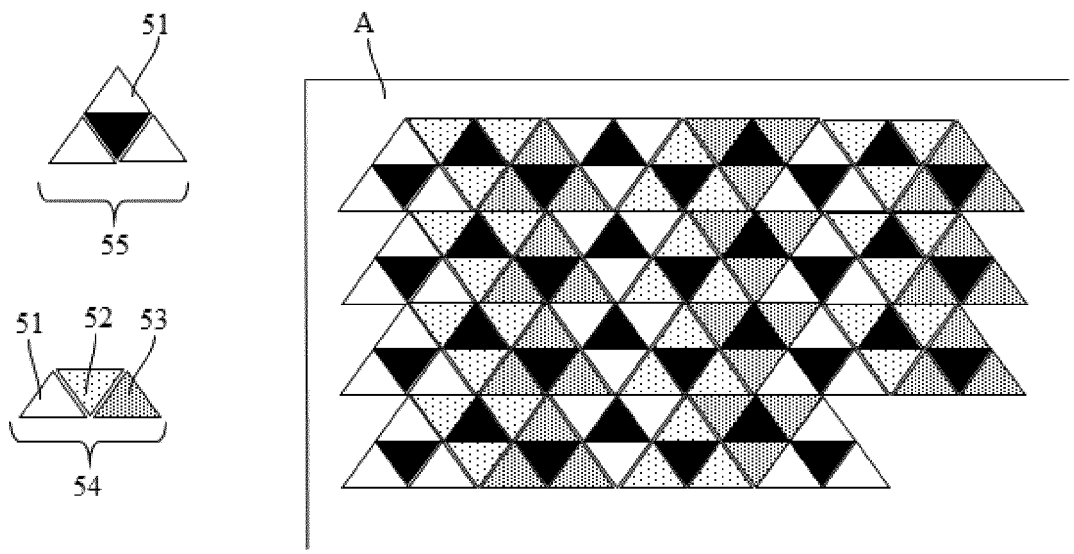
[Fig. 8]
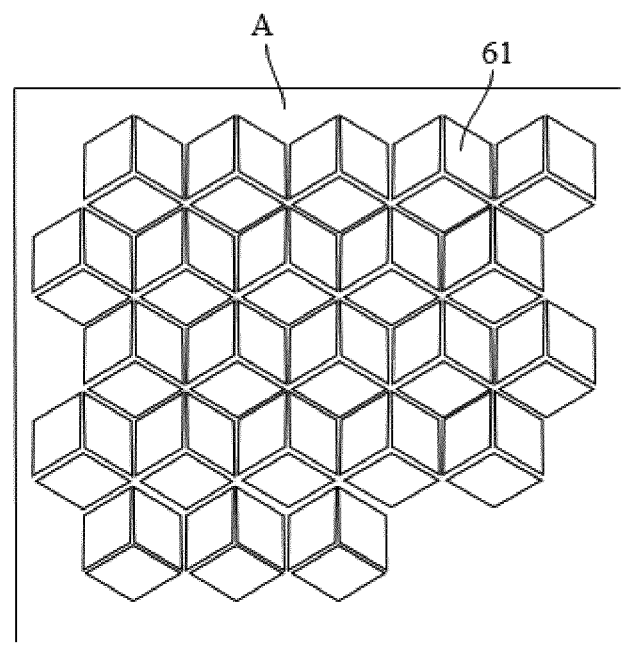

[Fig. 9]
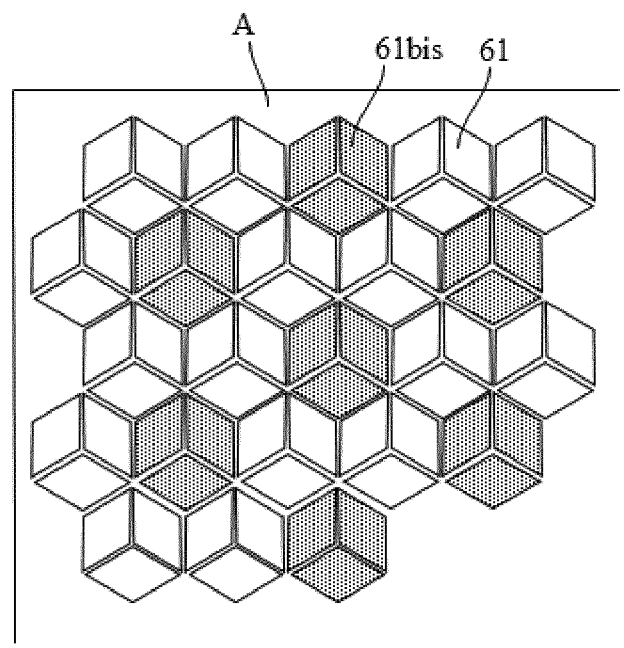
[Fig. 10]
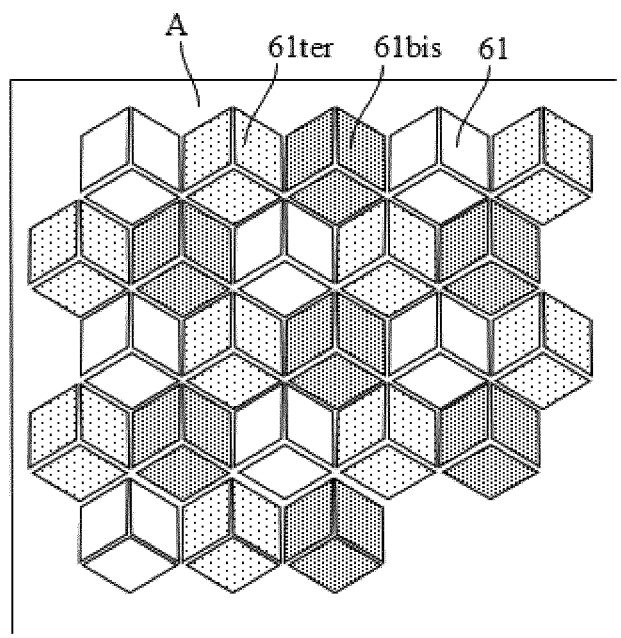

[Fig. 11]
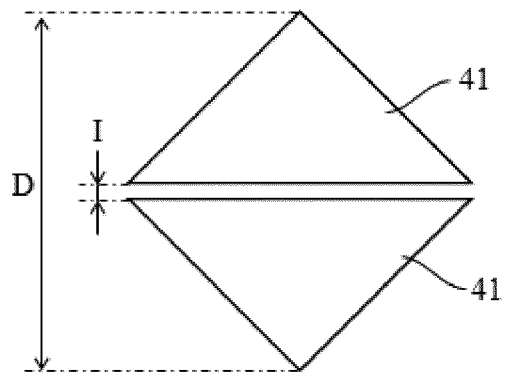
[Fig. 12]
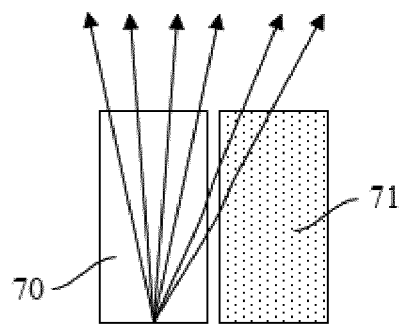
[Fig. 13]
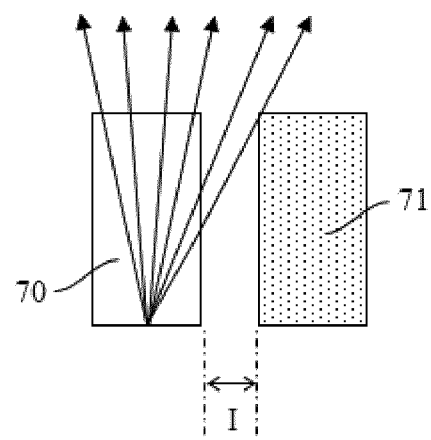

[Fig. 14]
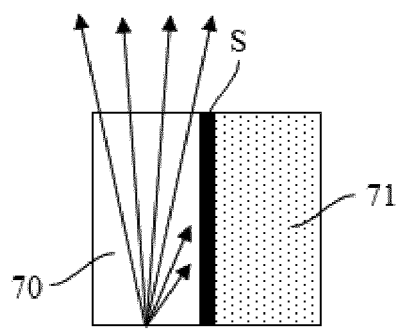
[Fig. 15]
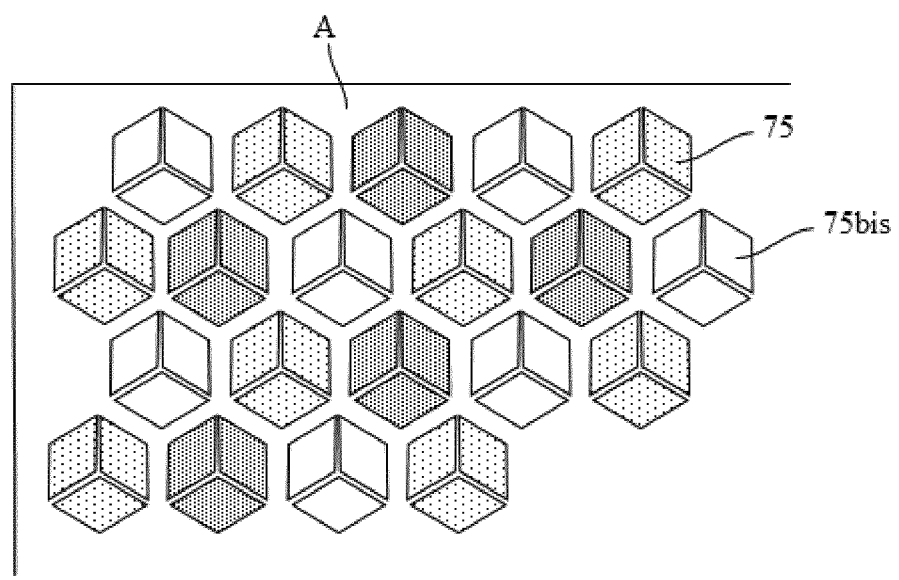

[Fig. 16]
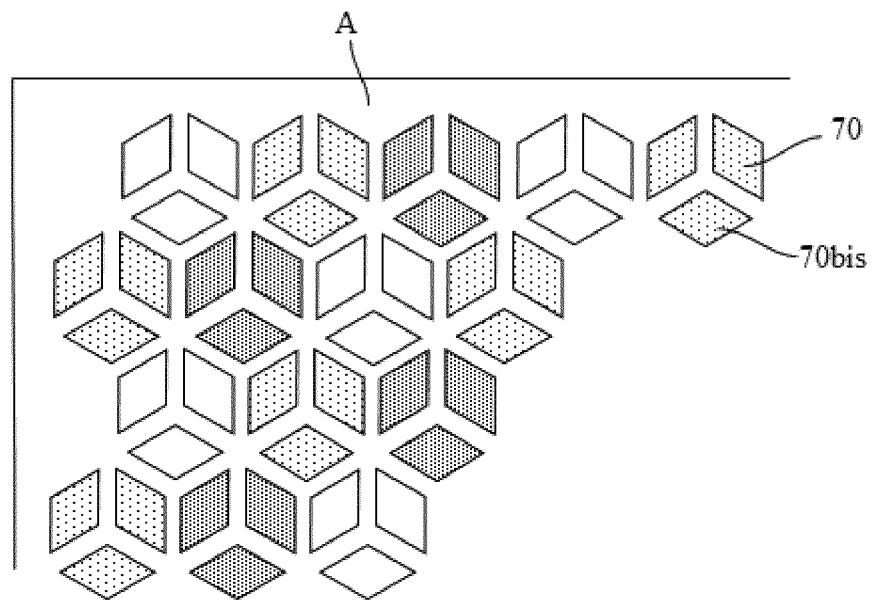
[Fig. 17]
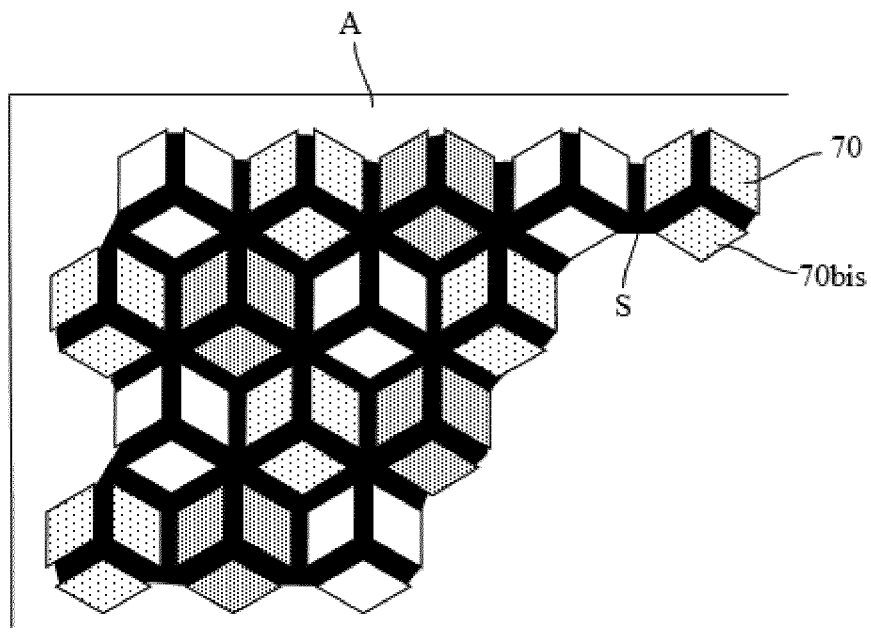

[Fig. 18]
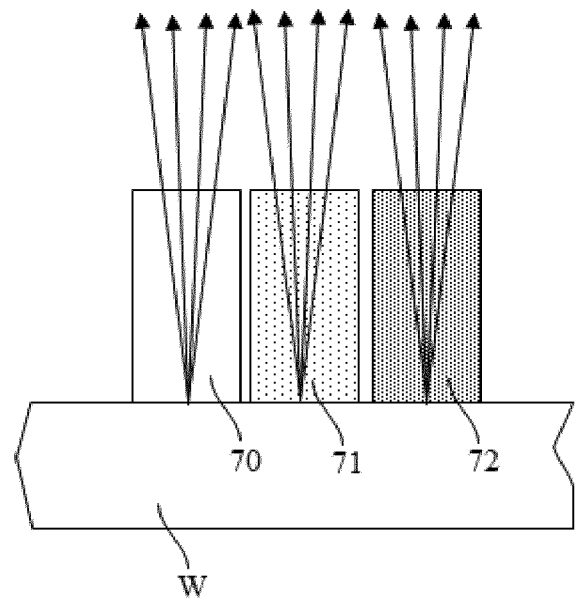
[Fig. 19]
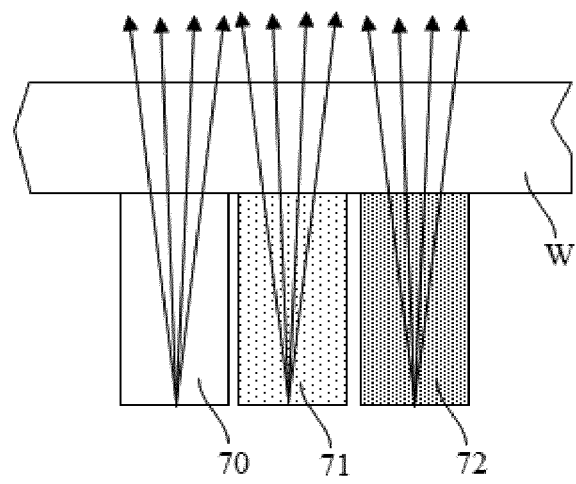

COLOUR DISPLAY DEVICE COMPRISING A MOSAIC OF TILES OF LIGHT-EMITTING MICRO-DIODES

CROSS-REFERENCE TO RELATED APPLICATIONS

This application is a National Stage of International patent application PCT/EP2020/086373, filed on Dec. 16, 2020, which claims priority to foreign French patent application No. FR 1914572, filed on Dec. 17, 2019, the disclosures of which are incorporated by reference in their entirety.

FIELD OF THE INVENTION

The invention is in the field of color displays made up of micro-light-emitting diodes.

BACKGROUND

The displays market is dominated by two types of display technology, namely liquid-crystal displays and light-emitting diode displays. Liquid-crystal displays, or LCDs, comprise a constant bright light source and a liquid-crystal matrix modulator; the modulation of the light transmitted by the source by each pixel of the modulator forms the image.

Light-emitting diode, or LED, displays comprise a matrix of light-emitting diodes; each pixel of the image is produced from a triplet of different colored diodes. Various technologies exist to produce elementary light-emitting diodes.

In the technology referred to as "OLED", the LEDs are produced based on organic materials. OLEDs are produced mainly by stacking thin layers having the characteristic functions of light-emitting diodes. They comprise an n-doped layer to contribute electrons, a p-doped layer to contribute holes and an intrinsic recombination layer for the emission of photons. These thin layers are deposited directly on an active matrix of transistors, the function of which is to control the current through the OLED in each pixel of the image.

A very promising technology has been emerging over the last few years, namely μLEDs. In this technology, light-emitting diodes are no longer deposited as thin layers on the active matrix. Rather, these are discrete components, produced most often on sapphire or silicon or silicon carbide, and which are transferred and connected to a glass plate. These μLEDs, in the same way as OLEDs, hence take on the role of light source and modulator.

μLEDs are, in principle, of small dimensions, not exceeding 100 to 200 micrometers. Depending on the size of the display screen produced and the resolution desired, a very large number of elementary components per screen must be installed, this number being between several hundreds of thousands and several millions of μLEDs.

Such an installation raises handling issues, given the small dimensions of the components, precision issues and production time issues given the large number of primary components to be installed.

SUMMARY OF THE INVENTION

The object of the invention is, before installation, to group together several individual light-emitting diodes of the same color onto a single substrate or "chip". The size of the component to be handled is thus increased, and the number of components to be installed is reduced.

More specifically, the invention relates to a color display device comprising a matrix of light sources, each light source comprising one and only one micro-light-emitting diode, the light sources being of three different colors, each color pixel of the matrix comprising at least a first source emitting in a first spectral band, a second source emitting in a second spectral band and a third source emitting in a third spectral band, characterized in that the matrix is formed by a group of elementary components of identical shape, each elementary component comprising at least two light-emitting diodes, all emitting either in the first spectral band, or in the second spectral band, or in the third spectral band;

the shape of said light-emitting diodes being either a triangle, or a quadrilateral, or a pentagon;

the elementary components being assembled such that a first side of a first diode of a first elementary component is close to the first side of a second diode of a second elementary component and such that a second side of said first diode of the first elementary component is close to a second side of a third diode of a third elementary component; the elementary components being assembled so as to tile the plane; the group formed by the first source associated with the first diode, the second source associated with the second diode and the third source associated with the third diode forming a color pixel.

Advantageously, each elementary component comprises four light-emitting diodes of rectangular or square shape arranged as a square, the color pixel having an L-shape.

Advantageously, each elementary component comprises two identical light-emitting diodes shaped as right-angled trapezoids and a third diode shaped as a symmetrical pentagon, the three diodes being configured to form a square and such that the color pixel has the shape of a regular hexagon.

Advantageously, each elementary component comprises three identical light-emitting diodes shaped as rhombuses, the three diodes being configured to form a first regular hexagon and such that the color pixel has the shape of a second regular hexagon identical in shape to the first hexagon.

Advantageously, each elementary component comprises two identical light-emitting diodes shaped as right-angled triangles, the two diodes being assembled by their hypotenuses to form a square, the color pixel comprising four light-emitting diodes arranged to form a second square, the side of the second square being equal to the hypotenuses of the triangular diodes, two diodes being arranged symmetrically, touching one another by their apexes and emitting in the same spectral band.

Advantageously, each elementary component comprises three identical light-emitting diodes shaped as a first isosceles triangle and assembled so as to form a second isosceles triangle, the side of which is equal to twice the side of the first isosceles triangle, the color pixel comprising three light-emitting diodes assembled so as to form an isosceles trapezoid.

Advantageously, each elementary component exhibits a thickness and each light-emitting diode emits light in a volume describing a light emission cone. The light-emitting diodes of each elementary component are separated from one another by a first separation distance greater than the elementary component thickness divided by the tangent of the angle of the light emission cone. The first distance is chosen such that the light emitted by a diode does not pass through the light-emitting diodes which are adjacent to it.

Advantageously, each elementary component exhibits a thickness and each light-emitting diode emits light in a volume describing a light emission cone. The elementary components are separated from one another by a first separation distance greater than the elementary component thickness divided by the tangent of the angle of the light emission cone. The first distance is chosen such that the light emitted by a diode does not pass through the light-emitting diodes of the adjacent elementary components.

Advantageously, the interstitial zones between the diodes of each elementary component are filled by a light-absorbing substance.

Advantageously, the interstitial zones between the elementary components are filled by a light-absorbing substance.

Advantageously, the color display device comprises light-emitting diodes not belonging to any color pixel, and the periphery of the display device comprises an opaque mask, the width of which is sufficient to mask the light-emitting diodes not belonging to any color pixel.

Advantageously, a part of the light-emitting diodes emitting in the first spectral band, the display device comprises a conversion filter arranged above the light-emitting diodes and arranged such that the light sources formed by said diodes and the conversion filter emit in the second spectral band or the third spectral band, the conversion filter comprising an elementary mosaic of tiles of various materials, the elementary tile of the mosaic having the shape of an elementary component.

Advantageously, a part of the light-emitting diodes emitting in the first spectral band, said diodes comprise a material carrying out a colorimetric conversion such that the light sources formed by said diodes emit, after conversion, in the second spectral band or the third spectral band.

Advantageously, the material is phosphorus-based or based on quantum dots.

Advantageously, the display device comprises anti-reflective glass arranged above the matrix of light sources.

Advantageously, the anti-reflective glass comprises an absorbent treatment on its rear surface.

The invention relates also to a method for producing a color display device comprising at least the following steps:
Step 1: Production of three types of semiconductor wafers, each type of wafer comprising a plurality of identical micro-light-emitting diodes, the micro-light-emitting diodes of the first type of wafer emitting in the first spectral band, the micro-light-emitting diodes of the second type of wafer emitting in the second spectral band and the micro-light-emitting diodes of the third type of wafer emitting in the third spectral band;
Step 2: Cutting-out of the elementary components in each type of wafer, each elementary component comprising at least two light-emitting diodes;
Step 3: Assembly of the elementary components so as to form a matrix of light-emitting diodes, each triplet formed by three light-emitting diodes emitting in the three different spectral bands forming the three light sources forming a color pixel of the matrix.

The invention relates also to a first variant of the method for producing a color display device, said variant embodiment comprising at least the following steps:
Step 1: Production of one type of semiconductor wafer, said type of wafer comprising a plurality of identical micro-light-emitting diodes emitting in the first spectral band;
Step 2: Cutting-out of the elementary components in each wafer, each elementary component comprising at least two light-emitting diodes;
Step 3: Assembly of the elementary components so as to form a matrix of light-emitting diodes;
Step 4: Depositing of a conversion filter arranged above the light-emitting diodes and arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged under three different tiles forming the three light sources forming a color pixel of the matrix.

The invention relates also to a first variant of the method for producing a color display device, said variant embodiment comprising at least the following steps:
Step 1: Production of one type of semiconductor wafer, said type of wafer comprising a plurality of identical micro-light-emitting diodes emitting in the first spectral band;
Step 2: Cutting-out of the elementary components in each wafer, each elementary component comprising at least two light-emitting diodes;
Step 3: Assembly of the elementary components so as to form a matrix of light-emitting diodes;
Step 4: Depositing of a conversion filter arranged above the light-emitting diodes and arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged under three different tiles forming the three light sources forming a color pixel of the matrix.

The invention relates also to a second variant of the method for producing a color display device, said variant embodiment comprising at least the following steps:
Step 1: Production of one type of semiconductor wafer, said type of wafer comprising a plurality of identical micro-light-emitting diodes emitting in the first spectral band;
Step 2: Cutting-out of the elementary components in each wafer, each elementary component comprising at least two light-emitting diodes;
Step 3: Depositing of a conversion filter arranged on a substrate arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged on three different tiles forming the three light sources forming a color pixel of the matrix;
Step 4: Assembly of the elementary components so as to form a matrix of light-emitting diodes, the light sources emitting through the substrate.

Advantageously, the step for depositing the conversion filter is carried out by inkjet means or by screen printing.

The invention relates also to a third variant of the method for producing a color display device, said variant embodiment comprising at least the following steps:

Step 1: Production of one type of semiconductor wafer, said type of wafer comprising a plurality of identical micro-light-emitting diodes emitting in the first spectral band;

Step 2: Depositing, on a first plurality of wafers, of a first conversion filter arranged above the light-emitting diodes and arranged such that the light sources formed by said diodes and the first conversion filter emit in the second spectral band, and depositing, on a second plurality of wafers, of a second conversion filter arranged above the light-emitting diodes and arranged such that the light sources formed by said diodes and the second conversion filter emit in the third spectral band;

Step 3: Cutting-out of the elementary components in each wafer, each elementary component comprising at least two light-emitting diodes;

Step 4: Assembly of the elementary components so as to form a matrix of light-emitting diodes, each triplet formed by three light-emitting diodes emitting in the three different spectral bands forming the three light sources forming a color pixel of the matrix.

BRIEF DESCRIPTION OF THE DRAWINGS

Other features, details and advantages of the invention will become clearer upon reading the description produced with reference to the appended drawings given by way of example and representing, respectively:

FIG. 1 an illustration of a partial view of a color display device according to the prior art;

FIG. 2 an illustration of a partial view of a first color display device according to the invention;

FIG. 3 an illustration of the head-to-tail assembly of the elementary components of the first color display device according to the invention;

FIG. 4 an illustration of a partial view of a second color display device according to the invention;

FIG. 5 an illustration of a partial view of a third color display device according to the invention;

FIG. 6 an illustration of a partial view of a fourth color display device according to the invention;

FIG. 7 an illustration of a partial view of a fifth color display device according to the invention;

FIG. 8 an illustration of the first step in an embodiment of a color display device according to the invention;

FIG. 9 an illustration of the second step in an embodiment of a color display device according to the invention;

FIG. 10 an illustration of the third step in an embodiment of a color display device according to the invention;

FIG. 11 an illustration of the dimensions of an elementary component according to the invention;

FIG. 12 an illustration of the propagation of parasitic light emitted by a light-emitting diode and diffused by an adjacent light-emitting diode;

FIG. 13 an illustration of the reduction in emitted parasitic light by having the light-emitting diodes further apart from one another;

FIG. 14 an illustration of the reduction in emitted parasitic light by absorption;

FIG. 15 an illustration of the reduction in emitted parasitic light by having the elementary components further apart from one another;

FIG. 16 an illustration of the reduction in emitted parasitic light by having the elementary components and the light-emitting diodes which form them further apart from one another;

FIG. 17 an illustration of the reduction in emitted parasitic light by having the elementary components further apart from one another, having the light-emitting diodes which form them further apart from one another, and putting absorption barriers in place;

FIG. 18 an illustration of a first emission mode for light-emitting diodes;

FIG. 19 an illustration of a second emission mode for light-emitting diodes.

DETAILED DESCRIPTION

FIG. 1 represents, in its righthand part, a partial view from above of a color display device A according to the prior art. It is formed of elementary micro-light-emitting diodes denoted by 1, 2 and 3 in this FIG. 1, emitting in three different color bands. In this figure, diodes of the same type are arranged in columns. In this representation, a color pixel 4 comprises three different diodes 1, 2 and 3 arranged in a row as shown in the lefthand part of FIG. 1. The diodes are installed individually with the drawbacks detailed earlier.

The color display device according to the invention comprises a matrix of light sources, each light source comprising one and only one micro-light-emitting diode, the light sources being of three different colors, each color pixel of the matrix comprising at least a first source emitting in a first spectral band, a second source emitting in a second spectral band and a third source emitting in a third spectral band.

The matrix is formed by a group of elementary components of identical shape, each elementary component comprising at least two light-emitting diodes, all emitting either in the first spectral band, or in the second spectral band, or in the third spectral band. After it is cut out, the handling of each component is made easier insofar as it is of a larger size than that of an individual light-emitting diode.

The shape of the light-emitting diodes is either a triangle, or a quadrilateral, or a pentagon. These simple shapes are invariant by a rotation of 90° for square designs, or by a rotation of 120° for designs with three diodes. The correct placement of the components and its variance is a dimensioning factor in the production of the display device. The invariances here facilitate component placement.

The elementary components are assembled such that a first side of a first diode of a first elementary component is close to a first side of a second diode of a second elementary component and such that a second side of said first diode of the first elementary component is close to contact with a second side of a third diode of a third elementary component, the group formed by the first source associated with the first diode, the second source associated with the second diode and the third source associated with the third diode forming a color pixel. Thus, a regular assembly of the elementary components which "tile the plane" is achieved. "Tiling the plane" is understood to mean an arrangement of a number of polygons bonded one to the other, such that when thus combined they form a whole and continuous plane. More specifically, a tiling of the Euclidean plane is achieved by the periodic arrangement of a plurality of polygons such that the sum of the internal angles of adjacent polygons meeting at a vertex is equal to 360°.

The various embodiments of the invention described in FIGS. 2, 4, 5, 6, 7, 8, 9 and 10 exhibit a tiling of the plane such that the sum of the internal angles of adjacent elementary components meeting at a vertex is equal to 360°. This means that matrices of light sources can be produced that are more compact, have a better resolution and easier component placement as compared with the prior art solutions.

Once assembled, the elementary light-emitting diodes are connected to an active matrix of transistors or individually associated with a control device.

The example embodiments of FIGS. 2, 4, 5, 6 and 7 will enable a better understanding of the invention. In these various figures, the diodes or associated light sources are represented in white when they are emitting in a first spectral band, in dotted shading when they are emitting in a second spectral band and in tightly dotted shading when they are emitting in a third spectral band.

FIG. 2 represents, in its righthand part, a partial view from above of a first color display device A according to the invention. Each elementary component 15 comprises four identical light-emitting diodes, such as 13, all emitting in the same spectral band and arranged as a square. The diodes are of rectangular or square shape. The color pixel 14 comprises three different light-emitting diodes 11, 12 and 13 arranged as an "L" as shown in the lefthand part of FIG. 2. As shown in FIG. 3, the matrix of the display device is produced by a tiling of the color pixels 14 which are arranged head-to-tail.

FIG. 4 represents, in its righthand part, a partial view from above of a second color display device A according to the invention. Each elementary component 25 comprises two identical light-emitting diodes 21 shaped as right-angled trapezoids and a third diode 21bis shaped as a symmetrical pentagon, the three diodes emitting in the same spectral band and being configured to form a square.

The rows of elementary components are arranged such that the color pixels 24 have the shape of regular hexagons as shown in the lefthand part of FIG. 4 in which the hexagon comprises the three diodes 21, 22 and 23bis.

FIG. 5 represents, in its righthand part, a partial view from above of a third color display device A according to the invention. Each elementary component 35 comprises three identical light-emitting diodes 31 or 32 or 33 shaped as rhombuses, the three diodes being configured to form a first regular hexagon such that the color pixel 34 has the shape of a second regular hexagon identical in shape to the first hexagon as shown in the lefthand part of FIG. 5. This pixel 34 is formed by the three diodes 31, 32 and 33.

FIG. 6 represents, in its righthand part, a partial view from above of a fourth color display device A according to the invention. Each elementary component 45 comprises two identical light-emitting diodes 41 shaped as right-angled triangles, the two diodes being assembled by their hypotenuses to form a square. The color pixel 44 comprises four light-emitting diodes arranged to form a second square, the side of the second square being equal to the hypotenuses of the triangular diodes, two diodes being arranged symmetrically, touching one another by their apexes and emitting in the same spectral band, as shown in the lefthand part of FIG. 6. Each square therefore comprises two diodes of the same type and two diodes of different types.

FIG. 7 represents, in its righthand part, a partial view from above of a fifth color display device according to the invention. Each elementary component 55 comprises three identical light-emitting diodes 51 or 52 or 53 shaped as a first isosceles triangle and assembled so as to form a second isosceles triangle, the side of which is equal to twice the side of the first isosceles triangle. The central part of this second triangle does not contain diodes. It can be used as an anodic or cathodic contact common to the three diodes of the component. The color pixel 54 comprises three light-emitting diodes 51, 52 and 53 assembled so as to form an isosceles trapezoid, as shown in the lefthand part of FIG. 7.

There are two emission modes for light-emitting diodes. In a first emission mode, the light-emitting diodes emit from the side away from the support or substrate which bears the components. The display device is referred to as being in "bottom emission" mode, the diodes being in "top emission" mode. This mode is represented in FIG. 18 which represents three diodes 70, 71 and 72 mounted on a substrate W. The arrows are representative of the direction of the emission of the diodes.

In a second emission mode, the light-emitting diodes emit through the support or substrate which bears the components. The display device is referred to as being in "top emission" mode, the diodes being in "bottom emission" mode. This mode is represented in FIG. 19 which represents three diodes 70, 71 and 72 mounted on a substrate W. The arrows are representative of the direction of the emission of the diodes. The display device according to the invention is compatible with these two emission modes.

The color display device according to the invention can be produced by means of various methods detailed below. The choice of method depends partly on the final emission mode of the light-emitting diodes.

A first production method comprises at least the following three steps:

Step 1: Production of three types of semiconductor wafers, each type of wafer comprising a plurality of identical micro-light-emitting diodes, the micro-light-emitting diodes of the first type of wafer emitting in the first spectral band, the micro-light-emitting diodes of the second type of wafer emitting in the second spectral band and the micro-light-emitting diodes of the third type of wafer emitting in the third spectral band. By way of example, the first type of wafer can be made from gallium nitride (GaN), the second type from aluminum gallium arsenide (AlGaAs) and the third type from indium gallium nitride (InGaN);

Step 2: Cutting-out of the elementary components in each type of wafer, each elementary component comprising at least two light-emitting diodes;

Step 3: Assembly of the elementary components so as to form a matrix of light-emitting diodes, each triplet formed by three light-emitting diodes emitting in the three different spectral bands forming the three light sources forming a color pixel of the matrix.

In this first method, the light source is the light-emitting diode. This method is compatible with the two emission modes for light-emitting diodes.

A second production method is suitable for the first emission mode, i.e. when the light-emitting diodes emit from the side away from the support or substrate which bears them. This method comprises at least the following four steps:

Step 1: Production of a single type of semiconductor wafer, said type of wafer comprising a plurality of identical micro-light-emitting diodes emitting in the first spectral band;

Step 2: Cutting-out of the elementary components in each wafer, each elementary component comprising at least two light-emitting diodes;

Step 3: Assembly of the elementary components so as to form a matrix of light-emitting diodes;

Step 4: Depositing of a conversion filter arranged above the light-emitting diodes and arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged under three different tiles forming the three light sources forming a color pixel of the matrix. The conversion material can be phosphorus-based or based on quantum dots.

In a variant embodiment, the depositing of the conversion filter can be carried out by inkjet means or by screen printing. The color filter functions only if the emission spectrum of the LED is substantially white. The color filter must also be produced before the cutting-out operation. The principle is represented in FIGS. 8, 9 and 10.

In a first step represented in FIG. 8, the tiling of the matrix is carried out by means of identical and monochrome elementary components 61 emitting, for example, in the first spectral band. In FIG. 8, the elementary components 61 comprise three diodes and are in the shape of a hexagon. In the case of FIG. 8, this tiling is identical to that of FIG. 5.

In a second step represented in FIG. 9, a deposition by inkjet means is carried out on some of the components; the ink provides for light emitted in the first spectral band to be converted into light emitted in the second band. The inked components in this second step are the components 61*bis*.

In a third step represented in FIG. 10, a second deposition by inkjet means on a second part of the components is carried out; the ink provides for light emitted in the first spectral band to be converted into light emitted in the third band. The inked components in this third step are the components 61*ter*.

Current techniques enable provision of ink depositions with micrometric precision.

A third production method is suitable for the second emission mode, i.e. when the light-emitting diodes emit through the support or substrate which bears them. This method comprises at least the following four steps:

Step 1: Production of one type of semiconductor wafer, said type of wafer comprising a plurality of identical micro-light-emitting diodes emitting in the first spectral band;

Step 2: Cutting-out of the elementary components in each wafer, each elementary component comprising at least two light-emitting diodes;

Step 3: Depositing of a conversion filter arranged on the wafer and arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged on three different tiles forming the three light sources forming a color pixel of the matrix;

Step 4: Assembly of the elementary components so as to form a matrix of light-emitting diodes, the light sources emitting through the wafer.

A fourth production method comprises at least the following four steps:

Step 1: Production of one type of semiconductor wafer, said type of wafer comprising a plurality of identical micro-light-emitting diodes emitting in the first spectral band;

Step 2: Depositing, on a first plurality of wafers, of a first conversion filter arranged above the light-emitting diodes and arranged such that the light sources formed by said diodes and the first conversion filter emit in the second spectral band, and depositing, on a second plurality of wafers, of a second conversion filter arranged above the light-emitting diodes and arranged such that the light sources formed by said diodes and the second conversion filter emit in the third spectral band;

Step 3: Cutting-out of the elementary components in each wafer, each elementary component comprising at least two light-emitting diodes;

Step 4: Assembly of the elementary components so as to form a matrix of light-emitting diodes, each triplet formed by three light-emitting diodes emitting in the three different spectral bands forming the three light sources forming a color pixel of the matrix.

This last method is compatible with both emission modes for light-emitting diodes.

The dimensions of the diodes are dependent on the application envisaged. It is known that the average angular resolution of a human eye is about 1 arc minute. Thus, if the display device is viewed at 25 centimeters, the spatial resolution of the eye is 77 microns. By way of example, FIG. 11 represents a square elementary component identical to those of FIG. 6 and formed by two triangular diodes 41 arranged head-to-tail. The diagonal D of the square is about 160 microns and the interval I between the two diodes is 20 microns.

Given the small dimensions of the diodes of the elementary components, the radiation from an emitting diode can have a parasitic effect on a neighboring diode. This phenomenon is known as "crosstalk". It is represented in FIG. 12 which represents a cross-sectional view of two diodes 70 and 71 arranged side-by-side. The radiation represented by arrows from the first light-emitting diode 70 is diffused by the adjacent second light-emitting diode 71. This phenomenon is further accentuated when the light sources comprise conversion filters arranged above the emitting diodes. It can hence be appropriate to make the wafer thinner in order to reduce as much as possible the parasitic light due to the primary radiation from diodes that is not yet filtered by the conversion filters.

To reduce this phenomenon, the simplest solution is to increase the separation distances I between the light-emitting diodes as shown in FIG. 13. The separation distances can be increased in two ways that can be combined. As shown in FIG. 15, it is possible to increase the distances between the different elementary components 75 and 75*bis*. In this figure, the components are in the shape of hexagons. It is also possible, as shown in FIG. 16, to increase the distances between the elementary light-emitting diodes 70 and 70*bis*.

The elementary components are produced with a stack of thin layers on a substrate. "H" denotes the overall thickness of an elementary component equal to the sum of the thickness of the substrate and that of the stack of thin layers. Each light-emitting diode emits light in a volume describing a light emission cone defined by an axis and a cone angle θ. Generally, to reduce the phenomenon of crosstalk, it is conceivable to choose a separation distance I between the light-emitting diodes that is greater than the thickness H of an elementary component divided by the tangent of θ, the angle of the emission cone of an adjacent diode. The same criterion applies to the choice of the distance separating adjacent micro-diodes.

To reduce the crosstalk, a substance S can also be added which absorbs the light between the diodes as shown in the cross-sectional view of FIG. 14 or in the view from above in FIG. 17.

One of the problems of this type of system is the tendency for the light to be guided along the substrate on which the light-emitting diodes rest. This guiding phenomenon can be stopped using several solutions.

One solution involves bonding, with an optical glue, antireflective glass above the light-emitting diodes. This antireflective glass will allow a maximum amount of light to be transmitted and prevent the guiding of light in the display device by canceling out some of the internal reflections.

This solution can be further improved by arranging a black treatment referred to as "black matrix" on the rear surface of the antireflective glass.

The production of the matrix by means of components which are not rectangular or which are offset means that the matrix cannot be perfectly rectangular. On the edge of the matrix, there are LEDs not belonging to any color pixel. The width of these areas does not exceed 100 microns. For esthetic reasons, these areas can be blackened using masking produced by a black opaque layer.

The invention claimed is:

1. A color display device comprising a matrix of light sources, each light source comprising one and only one micro-light-emitting diode, the light sources being of three different colors, each color pixel of the matrix comprising at least a first source emitting in a first spectral band, a second source emitting in a second spectral band and a third source emitting in a third spectral band,
    wherein the matrix is formed by a group of elementary components of identical shape, each elementary component comprising at least two light-emitting diodes, all emitting either in the first spectral band, or in the second spectral band, or in the third spectral band;
    the shape of said light-emitting diodes being either a triangle, or a quadrilateral, or a pentagon;
    the elementary components being assembled such that a first side of a first diode of a first elementary component is close to a first side of a second diode of a second elementary component and such that a second side of said first diode of the first elementary component is close to a second side of a third diode of a third elementary component, the elementary components being assembled so as to tile the plane; the group formed by the first source associated with the first diode, the second source associated with the second diode and the third source associated with the third diode forming a color pixel.

2. The color display device as claimed in claim 1, wherein each elementary component comprises four light-emitting diodes of rectangular or square shape arranged as a square, the color pixel having an L-shape.

3. The color display device as claimed in claim 1, wherein each elementary component comprises two identical light-emitting diodes shaped as right-angled trapezoids and a third diode shaped as a symmetrical pentagon, the three diodes being configured to form a square and such that the color pixel has the shape of a regular hexagon.

4. The color display device as claimed in claim 1, wherein each elementary component comprises three identical light-emitting diodes shaped as rhombuses, the three diodes being configured to form a first regular hexagon and such that the color pixel has the shape of a second regular hexagon identical in shape to the first hexagon.

5. The color display device as claimed in claim 1, wherein each elementary component comprises two identical light-emitting diodes shaped as right-angled triangles, the two diodes being assembled by their hypotenuses to form a square, the color pixel comprising four light-emitting diodes arranged to form a second square, the side of the second square being equal to the hypotenuses of the triangular diodes, two diodes being arranged symmetrically, touching one another by their apexes and emitting in the same spectral band.

6. The color display device as claimed in claim 1, wherein each elementary component comprises three identical light-emitting diodes shaped as a first isosceles triangle and assembled so as to form a second isosceles triangle, the side of which is equal to twice the side of the first isosceles triangle, the color pixel comprising three light-emitting diodes assembled so as to form an isosceles trapezoid.

7. The color display device as claimed in claim 1, wherein each elementary component exhibits a thickness and each light-emitting diode emits light in a volume describing a light emission cone;
    said device being wherein the light-emitting diodes of each elementary component are separated from one another by a first separation distance (I) greater than the elementary component thickness divided by the tangent of the angle of the light emission cone;
    the first distance being chosen such that the light emitted by a diode does not pass through the light-emitting diodes which are adjacent to it.

8. The color display device as claimed in claim 1, wherein each elementary component exhibits a thickness and each light-emitting diode emits light in a volume describing a light emission cone;
    said device being wherein the elementary components are separated from one another by a second separation distance greater than the elementary component thickness divided by the tangent of the angle of the light emission cone;
    the second distance being chosen such that the light emitted by each of their diodes does not pass through the light-emitting diodes of the adjacent elementary components.

9. The color display device as claimed in claim 1, wherein the interstitial zones between the diodes of each elementary component are filled by a light-absorbing substance(S).

10. The color display device as claimed in claim 1, comprising light-emitting diodes not belonging to any color pixel, wherein the interstitial zones between the elementary components are filled by a light-absorbing substance(S).

11. The color display device as claimed in claim 1, comprising light-emitting diodes not belonging to any color pixel, wherein the periphery of the display device comprises an opaque mask, the width of which is sufficient to mask the light-emitting diodes not belonging to any color pixel.

12. The color display device as claimed in claim 1, wherein, a part of the light-emitting diodes emitting in the first spectral band, the display device comprises a conversion filter arranged above the light-emitting diodes and arranged such that the light sources formed by said diodes and the conversion filter emit in the second spectral band or the third spectral band, the conversion filter comprising an elementary mosaic of tiles of various materials, the elementary tile of the mosaic having the shape of an elementary component.

13. The color display device as claimed in claim 1, wherein, a part of the light-emitting diodes emitting in the first spectral band, said diodes comprise a material carrying out a colorimetric conversion such that the light sources formed by said diodes emit, after conversion, in the second spectral band or the third spectral band.

14. The color display device as claimed in claim 12, wherein the material is phosphorus-based or based on quantum dots.

15. The color display device as claimed in claim 1, wherein the display device comprises anti-reflective glass arranged above the matrix of light sources.

16. The color display device as claimed in claim 15, wherein the anti-reflective glass comprises an absorbent treatment on its rear surface.

17. A method for producing a color display device as claimed in claim 1, said production method comprising at least the following steps:
- Step 1: production of three types of semiconductor wafers, each type of wafer comprising a plurality of identical micro-light-emitting diodes, the micro-light-emitting diodes of the first type of wafer emitting in the first spectral band, the micro-light-emitting diodes of the second type of wafer emitting in the second spectral band and the micro-light-emitting diodes of the third type of wafer emitting in the third spectral band;
- Step 2: cutting-out of the elementary components in each type of wafer, each elementary component comprising at least two light-emitting diodes;
- Step 3: assembly of the elementary components so as to form a matrix of light-emitting diodes, each triplet formed by three light-emitting diodes emitting in the three different spectral bands forming the three light sources forming a color pixel of the matrix.

18. The method for producing a color display device as claimed in claim 12, said production method comprising at least the following steps:
- Step 1: production of one type of semiconductor wafer, said type of wafer comprising a plurality of identical micro-light-emitting diodes emitting in the first spectral band;
- Step 2: cutting-out of the elementary components in each wafer, each elementary component comprising at least two light-emitting diodes;
- Step 3: assembly of the elementary components so as to form a matrix of light-emitting diodes;
- Step 4: depositing of a conversion filter arranged above the light-emitting diodes and arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged under three different tiles forming the three light sources forming a color pixel of the matrix.

19. The method for producing a color display device as claimed in claim 12, said production method comprising at least the following steps:
- Step 1: production of one type of semiconductor wafer, said type of wafer comprising a plurality of identical micro-light-emitting diodes emitting in the first spectral band;
- Step 2: cutting-out of the elementary components in each wafer, each elementary component comprising at least two light-emitting diodes;
- Step 3: depositing of a conversion filter arranged on a substrate arranged such that the light sources formed by said diodes and the conversion filter emit in the second spectral band and the third spectral band, the conversion filter comprising a mosaic of three types of tiles providing the different conversions, the elementary tiles of the mosaic having the shape of an elementary component, each triplet formed by three light-emitting diodes arranged on three different tiles forming the three light sources forming a color pixel of the matrix;
- Step 4: assembly of the elementary components so as to form a matrix of light-emitting diodes, the light sources emitting through the substrate.

20. The method for producing a color display device as claimed in claim 18, wherein the step for depositing the conversion filter is carried out by inkjet means or by screen printing.

21. The method for producing a color display device as claimed in claim 14, said production method comprising at least the following steps:
- Step 1: production of one type of semiconductor wafer, said type of wafer comprising a plurality of identical micro-light-emitting diodes emitting in the first spectral band;
- Step 2: depositing, on a first plurality of wafers, of a first conversion filter arranged above the light-emitting diodes and arranged such that the light sources formed by said diodes and the first conversion filter emit in the second spectral band, and depositing, on a second plurality of wafers, of a second conversion filter arranged above the light-emitting diodes and arranged such that the light sources formed by said diodes and the second conversion filter emit in the third spectral band;
- Step 3: cutting-out of the elementary components in each wafer, each elementary component comprising at least two light-emitting diodes;
- Step 4: assembly of the elementary components so as to form a matrix of light-emitting diodes, each triplet formed by three light-emitting diodes emitting in the three different spectral bands forming the three light sources forming a color pixel of the matrix.

* * * * *